United States Patent
Cho

(10) Patent No.: US 8,436,626 B2
(45) Date of Patent: May 7, 2013

(54) CASCADED-BASED DE-EMBEDDING METHODOLOGY

(75) Inventor: Hsiu-Ying Cho, Hsin-Chu (TW)

(73) Assignee: Taiwan Semiconductor Manfacturing Company, Ltd., Hsin-Chu (TW)

( * ) Notice: Subject to any disclaimer, the term of this patent is extended or adjusted under 35 U.S.C. 154(b) by 714 days.

(21) Appl. No.: 12/640,138

(22) Filed: Dec. 17, 2009

(65) Prior Publication Data

US 2011/0151596 A1    Jun. 23, 2011

(51) Int. Cl.
   *G01R 27/28* (2006.01)
(52) U.S. Cl.
   USPC ......... 324/615; 324/601; 324/638; 324/616; 324/637; 702/196; 702/105; 702/106; 702/107; 702/168; 702/179; 702/180; 702/181; 702/182; 702/183; 702/184; 702/185; 702/186; 702/187; 702/188; 702/85
(58) Field of Classification Search .......... 324/601, 324/638, 615, 616, 637; 702/196, 105–107, 702/168, 179–188, 85
See application file for complete search history.

(56) References Cited

U.S. PATENT DOCUMENTS

| | | | | | |
|---|---|---|---|---|---|
| 4,476,446 | A | * | 10/1984 | Blight | 333/32 |
| 4,982,164 | A | * | 1/1991 | Schiek et al. | 324/638 |
| 5,047,725 | A | * | 9/1991 | Strid et al. | 324/601 |
| 5,097,215 | A | * | 3/1992 | Eul et al. | 324/601 |
| 5,313,166 | A | * | 5/1994 | Eul et al. | 324/601 |
| 5,371,468 | A | * | 12/1994 | Pelster | 324/638 |
| 5,440,236 | A | * | 8/1995 | Schiek et al. | 324/601 |
| 5,467,021 | A | * | 11/1995 | Adamian et al. | 324/601 |
| 5,502,392 | A | * | 3/1996 | Arjavalingam et al. | 324/638 |
| 5,537,046 | A | * | 7/1996 | Adamian et al. | 324/601 |
| 5,548,221 | A | * | 8/1996 | Adamian et al. | 324/601 |
| 5,548,538 | A | * | 8/1996 | Grace et al. | 702/85 |
| 5,552,714 | A | * | 9/1996 | Adamian et al. | 324/601 |
| 5,578,932 | A | * | 11/1996 | Adamian | 324/601 |
| 5,608,330 | A | * | 3/1997 | Heuermann et al. | 324/601 |
| 6,041,077 | A | * | 3/2000 | Clark et al. | 375/224 |
| 6,064,694 | A | * | 5/2000 | Clark et al. | 375/224 |
| 6,838,885 | B2 | * | 1/2005 | Kamitani | 324/601 |
| 6,878,964 | B1 | | 4/2005 | Lien et al. | |
| 6,961,669 | B2 | | 11/2005 | Brunsman | |
| 7,323,861 | B2 | * | 1/2008 | Bucksch | 324/750.02 |
| 7,375,534 | B2 | * | 5/2008 | Kamitani | 324/650 |
| 7,405,576 | B2 | * | 7/2008 | Kamitani | 324/650 |

(Continued)

OTHER PUBLICATIONS

Ming-Hsiang Cho et al., "A Scalable Noise De-Embedding Technique for On-Wafer Microwave Device Characterization", IEEE Microwave and Wireless Components Letters, vol. 15, No. 10, Oct. 2005, pp. 649-651 (Cho_2005).*

(Continued)

*Primary Examiner* — Patrick Assouad
*Assistant Examiner* — Lamarr Brown
(74) *Attorney, Agent, or Firm* — Slater & Matsil, L.L.P.

(57) ABSTRACT

An embodiment is a method for de-embedding. The method comprises forming a primary structure in a semiconductor chip and forming an auxiliary structure in the semiconductor chip. The auxiliary structure replicates a first portion of the primary structure. The method further comprises determining a transmission matrix for each of the primary structure and the auxiliary structure based on measurements and extracting a transmission matrix of a first component of the primary structure by determining a product of the transmission matrix of the primary structure and an inverse of the transmission matrix of the auxiliary structure.

20 Claims, 7 Drawing Sheets

U.S. PATENT DOCUMENTS

| | | | | |
|---|---|---|---|---|
| 7,439,748 | B2* | 10/2008 | Kamitani | 324/601 |
| 7,865,319 | B1* | 1/2011 | Jacobs et al. | 702/57 |
| 2003/0120449 | A1* | 6/2003 | Kamitani | 702/107 |
| 2004/0051538 | A1* | 3/2004 | Adamian | 324/601 |
| 2004/0066251 | A1* | 4/2004 | Eleftheriades et al. | 333/117 |
| 2004/0100276 | A1* | 5/2004 | Fanton | 324/601 |
| 2004/0251922 | A1* | 12/2004 | Martens et al. | 324/760 |
| 2005/0179444 | A1* | 8/2005 | Tiemeijer | 324/637 |
| 2006/0043978 | A1* | 3/2006 | Simon | 324/601 |
| 2006/0114004 | A1* | 6/2006 | Tiemeijer | 324/638 |
| 2006/0155498 | A1* | 7/2006 | Dunsmore et al. | 702/107 |
| 2006/0181286 | A1* | 8/2006 | Adamian | 324/601 |
| 2006/0226854 | A1* | 10/2006 | Cole | 324/615 |
| 2007/0030012 | A1* | 2/2007 | Kamitani | 324/601 |
| 2007/0152678 | A1* | 7/2007 | Matoba et al. | 324/601 |
| 2007/0276622 | A1* | 11/2007 | Pickerd et al. | 702/106 |
| 2008/0010034 | A1* | 1/2008 | Yamasaki | 702/85 |
| 2008/0048673 | A1* | 2/2008 | Tan et al. | 324/601 |
| 2008/0048674 | A1* | 2/2008 | Tan et al. | 324/601 |
| 2008/0048677 | A1* | 2/2008 | Tan et al. | 324/638 |
| 2008/0191712 | A1* | 8/2008 | Eisenstadt et al. | 324/638 |
| 2008/0204039 | A1* | 8/2008 | Wong et al. | 324/601 |
| 2008/0258738 | A1* | 10/2008 | Martens et al. | 324/601 |
| 2008/0278177 | A1* | 11/2008 | Simon | 324/601 |
| 2009/0224772 | A1* | 9/2009 | Jagannathan et al. | 324/601 |
| 2010/0001742 | A1* | 1/2010 | Strid et al. | 324/601 |
| 2010/0156447 | A1* | 6/2010 | Roussel et al. | 324/754 |
| 2011/0102007 | A1* | 5/2011 | Ghadaksaz | 324/755.02 |
| 2011/0178751 | A1* | 7/2011 | Mori | 702/85 |
| 2011/0238383 | A1* | 9/2011 | Metzger | 702/196 |
| 2011/0254576 | A1* | 10/2011 | Cho | 324/756.01 |
| 2011/0298476 | A1* | 12/2011 | Degerstrom et al. | 324/615 |
| 2012/0169351 | A1* | 7/2012 | Simpson | 324/601 |
| 2012/0197577 | A1* | 8/2012 | Huang | 702/106 |

OTHER PUBLICATIONS

Ming-Hsiang Cho et al., "A Novel Cascade-Based De-embedding Method for On-Wafer Microwave Characterization and Automatic Measurement", IEEE MTT-S International Miicrowave Symposium Digest, Jun. 2004, pp. 1237-1240 (Hsiang_Cho_2004).*

Chih-Hung Chen et al., "A General Noise and S-Parameter Deembedding Procedure for On-Wafer High-Frequency Noise Measurements of MOSFETs", Transactions on Microwave Theory and Techniques, vol. 49, No. 5, May 2001, pp. 1004-1005 (Hung_Chen_2001).*

Troels Kolding, "A Four-Step Method for De-Embedding Gigahertz On-Wafer CMOS Measurements", IEEE Transactions on Electronic Devices, vol. 47, No. 4, Apr. 2000, pp. 734-740 (Kolding_2000).*

Simion et al., "CPW Antenna Fabricated on Silicon Substrate Based on Transmission Line Metamaterial Approach", Electromagnetics in Advaned Applications, 2007, pp. 488-491.*

Riblet, "An Explicit Derivation of the Relationships Between the Parameters of an Interdigital Structure and the Equivalent Transmission-Line Cascade", IEEE Transactions on Microwave Theory and Techniques, vol. MTT-15, No. 3, Mar. 1967, pp. 161-166.*

Bowron, "Matrices for dual representation of four-terminal non-uniform transmission lines", The Radio and Electronic Engineer, vol. 43, No. 9, Sep. 1973. pp. 537-544.*

Shirakawa et al., "Synthesis of Some Classes of Multivariable Cascaded Transmission-Line Networks", IEEE Transactions on Circuit Theory, 1968, pp. 138-143.*

Fathelbab, "The Synthesis of a Class of Branch-Line Directional Couplers", IEEE Transactions on Microwave Theory and Techniques, vol. 56, No. 8, Aug. 2008, pp. 1985-1994.*

"Agilent Technologies Announces Breakthrough in X-Parameter Nonlinear model Generation for Components Used in Wireless, Aerospace Defense Industries: X-Parameters Enable Model Generation form Simulation or Measurement, for Fast Development", Agilent Technologies, Dec. 17, 2008, pp. 1-3.*

"TDR, S-Parameters & Differential Measuresments", Agilent Technologies, Mar. 2008, pp. 1-19.*

"TDR, S-Parameters & Differential Measurements", Agilent Technologies, Mar. 2008, p. 20.*

"Data Mining 12-Port S-Parameters", Agilent Technologies, Aug. 11, 2008, pp. 1-15.*

"Multiport and Balanced Device Measurement Application Note Series: An Introduction to Multiport and Balanced Device Measurement", Agilent Technologies, pp. 1-12.*

Tretiakov, Y., et al., "A New On-Wafer De-Embedding Technique for On-Chip RF Transmission Line Interconnect Characterization," 63$^{rd}$ ARFTG Conference Digest, downloaded on Dec. 15, 2008, IEEE, pp. 69-72.

Pozar, D.M., "Microwave Network Analysis," Microwave Engineering, Second Edition, 1999, pp. 182-213.

Tran, L.N., et al., "CAD-Oriented Model of a Coplanar Line on a Silicon Substrate Including Eddy-Current Effects and Skin Effect," IEEE Transactions on Microwave Theory and Techniques, vol. 56, No. 3, Mar. 2008, pp. 663-670.

Zwick, T., et al., "On-Chip SiGe Transmission Line Measurements and Model Verification up to 110GHz," Submission to IEEE Microwave and Wireless Components Letters, Feb. 2005, pp. 1-3.

Cho, H.-Y., et al., "A Novel Transmission-Line Deembedding Technique for RF Device Characterization," IEEE Transsactions on Electron Devices, vol. 56, No. 12, Dec. 2009, pp. 3160-3167.

* cited by examiner

CASCADED-BASED DE-EMBEDDING METHODOLOGY

TECHNICAL FIELD

The disclosure relates generally to a method for de-embedding, and more particularly to a method for de-embedding components of a cascaded network.

BACKGROUND

Generally, de-embedding is the extraction of parasitic behaviors of components in an electrical network to determine the electrical behavior of a particular component within the electrical network. By extracting the parasitic values from a measured behavior of the network, the particular component may be isolated from the remainder of the network and evaluated independently. De-embedding is particularly useful in the semiconductor industry to isolate a structure within an integrated circuit to determine if the structure is operating correctly, such as during wafer acceptance testing (WAT). For example, during WAT, it may be desirable to extract parasitics caused by pads, interconnects, and transmission lines from a network that also includes a device under test (DUT) to analyze the DUT independently from the network.

Typical de-embedding techniques generally require measuring the behavior of the network, determining some representation of the network such as by parameters that are known in the art, using equivalent circuits to model parasitics in components, and using mathematical manipulations of the representation of the network and the model to determine the behavior of the desired component.

However, these techniques may suffer from disadvantages. A disadvantage is that the model used may become invalid when electrical properties of the networks cannot be modeled by an equivalent circuit or that an accurate equivalent circuit would be difficult to obtain or use, such as if interconnect or transmission lines lengths become too long or the operating frequency becomes too high. Another disadvantage is that the model may assume that a ground strip typically used in a structure may have negligible effects on the electrical properties of the structure. The model may ignore these effects that may be significant at high frequencies which may result in over de-embedding. Accordingly, there is a need in the art to overcome these disadvantages.

SUMMARY

An embodiment is a method for de-embedding. The method comprises forming a primary structure in a semiconductor chip and forming an auxiliary structure in the semiconductor chip. The auxiliary structure replicates a first portion of the primary structure. The method further comprises determining a transmission matrix for each of the primary structure and the auxiliary structure based on measurements and extracting a transmission matrix of a first component of the primary structure by determining a product of the transmission matrix of the primary structure and an inverse of the transmission matrix of the auxiliary structure.

In accordance with another embodiment, a method for de-embedding a cascaded network comprises measuring electrical characteristics of a primary structure and a first auxiliary structure to determine a transmission matrix of each of the primary structure and the first auxiliary structure, and extracting a transmission matrix of a first component of the primary structure by multiplying the transmission matrix of the primary structure and an inverse of the transmission matrix of the auxiliary structure. The primary structure and the first auxiliary structure are formed in a semiconductor chip, and the auxiliary structure replicates a first portion of the primary structure.

A further embodiment is a method for de-embedding components. The method comprises forming a dual transmission line structure in a semiconductor chip and forming a first auxiliary transmission line structure in the semiconductor chip. The first auxiliary transmission line structure is representative of a first portion of the dual transmission line structure. The method further comprises measuring electrical properties of the dual transmission line structure and the first auxiliary transmission line structure, determining a transmission matrix for each of the dual transmission line structure and the first auxiliary transmission line structure based on the measuring the electrical properties, and multiplying the transmission matrix of the dual transmission line structure and an inverse of the transmission matrix of the first auxiliary transmission line structure to extract a transmission matrix of a first component of the dual transmission line structure.

BRIEF DESCRIPTION OF THE DRAWINGS

For a more complete understanding of embodiments, and the advantages thereof, reference is now made to the following descriptions taken in conjunction with the accompanying drawing, in which.

DETAILED DESCRIPTION OF ILLUSTRATIVE EMBODIMENTS

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments will be described in a specific context, namely a dual transmission line structure. However, other embodiments may also include other structures, such as device under tests (DUTs), such as metal-oxide-silicon field effect transistors (MOSFETs), metal-oxide-metal (MOM) capacitors, or resistors.

Embodiments generally involve an electrical network and at least one auxiliary network in a semiconductor device. The auxiliary network may be representative of a portion of the electrical network and may be used as a basis to de-embed another component of the electrical network. Measurements for each network may be taken, and a transmission matrix, or ABCD matrix, may be determined for each network from the measurements. Using the transmission matrices, algebraic manipulations of the matrices may result in a de-embedded transmission matrix of the component that is being isolated.

Figure 1:
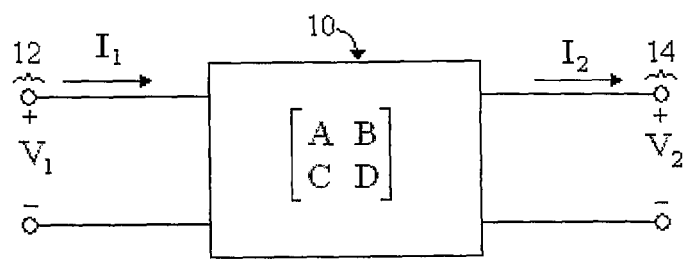
FIG. 1 is a representation of a dual-port network.

A transmission matrix is a simple means to characterize a two-port network. The transmission matrix is defined as represented in equations (1), (2), and (3) and FIG. 1. FIG. 1 illustrates a two-port network 10 with a first port (Port 1) 12 and a second port (Port 2) 14. A first voltage $V_1$ and a second voltage $V_2$ are illustrated at Port 1 12 and Port 2 14, respectively. A first current $I_1$ flows into Port 1 12, and a second current $I_2$ flows out of Port 2 14. From this representation and convention, equations (1) and (2) are derived.

$$V_1 = AV_2 + BI_2 \tag{1}$$

$$I_1 = CV_2 + DI_2 \tag{2}$$

In matrix form, equations (1) and (2) are represented in equation (3).

$$\begin{bmatrix} V_1 \\ I_1 \end{bmatrix} = \begin{bmatrix} A & B \\ C & D \end{bmatrix} \begin{bmatrix} V_2 \\ I_2 \end{bmatrix} \tag{3}$$

Figure 2:
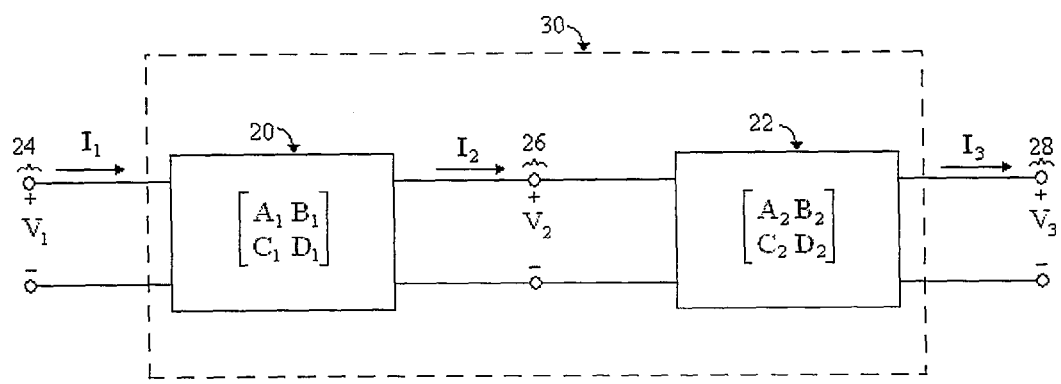
FIG. 2 is a representation of a cascaded network comprising two dual-port networks.

Using this transmission matrix, calculations for larger networks may be achieved simply. For example, multiple two-port networks may be cascaded, or in other words, connected serially, and a single transmission matrix may be calculated for the combined network. FIG. 2 illustrates cascaded two-port networks. FIG. 2 comprises a first two-port network 20 and a second two-port network 22 that are cascaded, or in other words, the first port (Port 1) of the second two-port network 22 is coupled to the second port (Port 2) 26 of the first two-port network. The first two-port network 20 further comprises a first port (Port 1) 24, and the second two-port network 22 comprises a second port (Port 2) 28. Respective first, second, and third voltages $V_1$, $V_2$ and $V_3$ and first, second, and third currents $I_1$, $I_2$, and $I_3$ are also illustrated. The first and second two-port networks 20 and 22 constitute a combined cascaded network 30.

Individually, the first two-port network 20 has a transmission matrix as shown in equation (4), and the second two-port network 22 has a transmission matrix as shown in equation (5).

$$\begin{bmatrix} V_1 \\ I_1 \end{bmatrix} = \begin{bmatrix} A_1 & B_1 \\ C_1 & D_1 \end{bmatrix} \begin{bmatrix} V_2 \\ I_2 \end{bmatrix} \tag{4}$$

$$\begin{bmatrix} V_2 \\ I_2 \end{bmatrix} = \begin{bmatrix} A_2 & B_2 \\ C_2 & D_2 \end{bmatrix} \begin{bmatrix} V_3 \\ I_3 \end{bmatrix} \tag{5}$$

By substituting equation (5) into equation (4), as in equation (6), the transmission matrix for the cascaded network 30 may be determined.

$$\begin{bmatrix} V_1 \\ I_1 \end{bmatrix} = \begin{bmatrix} A_1 & B_1 \\ C_1 & D_1 \end{bmatrix} \begin{bmatrix} A_2 & B_2 \\ C_2 & D_2 \end{bmatrix} \begin{bmatrix} V_3 \\ I_3 \end{bmatrix} \tag{6}$$

Thus, the transmission matrix for the cascaded network 30, matrix $[T_{CN}]$, is as follows in equation (7):

$$[T_{CN}] = \begin{bmatrix} A_1 & B_1 \\ C_1 & D_1 \end{bmatrix} \begin{bmatrix} A_2 & B_2 \\ C_2 & D_2 \end{bmatrix} \tag{7}$$

These concepts apply equally to cascaded networks comprising many more individual two-port networks.

According to embodiments, a two-port network is considered and is treated as a cascaded network comprising multiple two-port networks. A replica of one or more of the multiple two-port networks is formed in a semiconductor chip along with the cascaded network. Once measurements on the replica network and the cascaded network are made and a transmission matrix for each is determined, the transmission matrix for the remaining ones of the multiple networks may be extracted.

Figure 3:
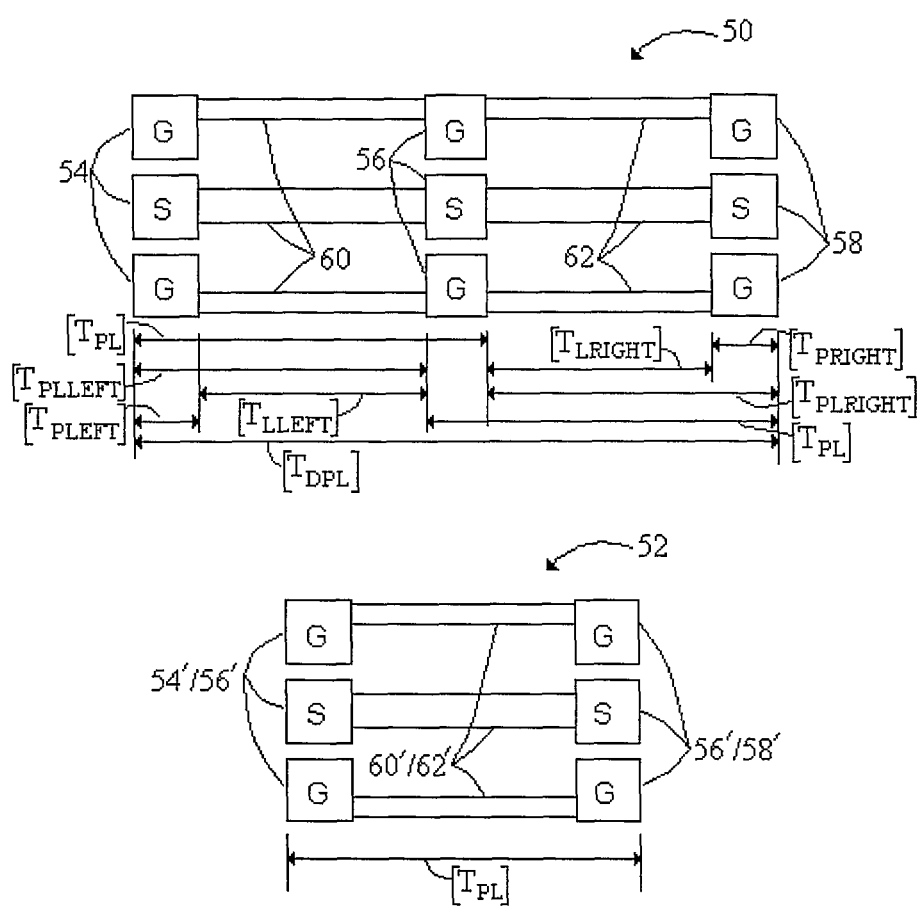
FIG. 3 is an exemplary embodiment of a symmetric dual transmission line structure and an auxiliary transmission line structure formed in a semiconductor chip.
Figure 6A:
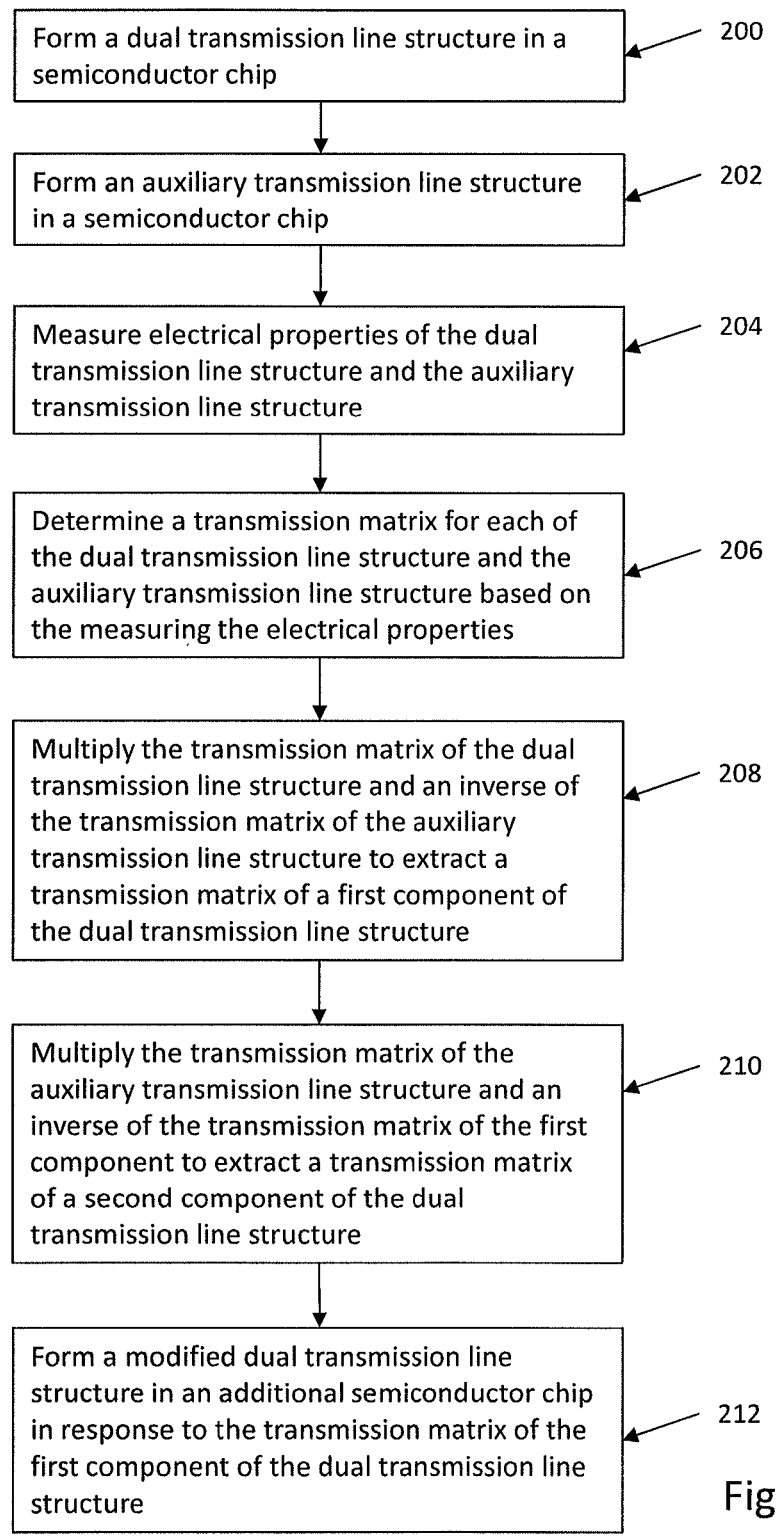
FIGS. 6A-6B are flow charts of example method embodiments.

FIG. 3 is an exemplary embodiment, which is also discussed in the context of the method in FIG. 6A, of a symmetric dual transmission line structure 50 (step 200) and an auxiliary transmission line structure 52 (step 202) formed in a semiconductor chip. The dual transmission line structure 50 comprises pads 54, 56, and 58 and transmission lines 60 and 62 in a conventional ground-signal-ground (GSG) configuration. The auxiliary transmission line structure 52 represents either half of the dual transmission line structure 54. Accordingly, the auxiliary transmission line structure 52 comprises pads 54'/56' and 56'/58' that replicate corresponding pads 54, 56, and 58 in the dual transmission line structure 50. Likewise, the auxiliary transmission line structure 52 comprises transmission line 60'/62' that replicates transmission lines 60 and 62 in the dual transmission line structure 50. Note that these structures are illustrated for simplicity and omit many structures that may be included, such as vias, multi-level interconnects, and DUTs.

Measurements may be performed on the dual transmission line structure 50 and the auxiliary transmission line structure 52 (step 204) to determine a transmission matrix for each structure (step 206). For example, S-parameters may be measured on the dual transmission line structure 50 and the auxiliary transmission line structure 52 up to 50 GHz using an Agilent 8510C. From these S-parameters, the transmission matrices of the dual transmission line structure 50 and the auxiliary transmission line structure may be determined using known methods. For the purposes of this discussion, matrix $[T_{DPL}]$ is the transmission matrix determined from the measurements of the dual transmission line structure 50, and matrix $[T_{PL}]$ is the transmission matrix determined from the measurements of the auxiliary transmission line structure 52.

FIG. 3 further illustrates reference lines for dividing dual transmission line structure 50 into cascaded two-port networks. The individual illustrated transmission matrices $[T_X]$ will not be discussed in detail herein, except to note that matrices that include a subscript P represent a network that includes pads, a subscript L represent transmission lines, and subscripts LEFT and RIGHT respectively represent the left and right side of dual transmission line structure 50. A person having ordinary skill in the art will realize that the transmission matrix $[T_{DPL}]$ for the dual transmission line structure 50 is equal to the product of many different combinations of the transmission matrices illustrated, such as equation (8).

$$[T_{DPL}] = [T_{PLLEFT}][T_{PL}] \tag{8}$$

Using equation (8), the inverse of matrix $[T_{PL}]$ may be multiplied to both sides of the equation to cancel matrix $[T_{PL}]$ on the right hand side (step 208). The result of this action is that the transmission matrix $[T_{PLLEFT}]$ for the network consisting of pads 54 and transmission lines 60 equals the product of measured transmission matrix $[T_{DPL}]$ and the inverse of measured transmission matrix $[T_{PL}]$, as shown in equation (9).

$$[T_{PLLEFT}] = [T_{DPL}][T_{PL}]^{-1} \tag{9}$$

Accordingly, the transmission matrix for the network consisting of the left side of the dual transmission line structure 50 may be extracted.

Once matrix [$T_{PLLEFT}$] is extracted, it can be used to extract further components. A person having ordinary skill in the art will further realize that matrix [$T_{PL}$] equals the product of matrix [$T_{PLLEFT}$] and matrix [$T_{PRIGHT}$], as shown in equation (10).

$$[T_{PL}] = [T_{PLLEFT}][T_{PRIGHT}] \quad (10)$$

Multiplying (step 210) the inverse of matrix [$T_{PLLEFT}$] through the equation, while maintaining the generally non-commutative property of matrix multiplication, matrix [$T_{PLLEFT}$] equals the product of the inverse of matrix [$T_{PLLEFT}$] and matrix [$T_{PL}$], as shown in equation (11).

$$[T_{PRIGHT}] = [T_{PLLEFT}]^{-1}[T_{PL}] \quad (11)$$

Accordingly, matrix [$T_{PRIGHT}$] may be extracted.

At this point, it is worth noting that the transmission matrices designated with subscript RIGHT are generally, but not necessarily, equal to corresponding transmission matrices designated with subscript LEFT, for example, [$T_{PRIGHT}$]= [$T_{PLEFT}$] but [$T_{PLRIGHT}$]≠[$T_{PPLEFT}$] in most instances, because of the symmetry of the dual transmission line structure 50. However, the LEFT and RIGHT designations may be helpful when calculating different matrices so as not to run afoul of the non-commutative property of matrix multiplication.

Equations (12) through (15) illustrate another example to extract [$T_{PLRIGHT}$] and [$T_{PLEFT}$] applying similar principles as discussed above with regard to equations (8) through (11). Detailed discussion is omitted for this example because a person having ordinary skill in the art will readily understand the application of the principles and computations. Further, other components may be extracted by simply applying these principles in similar manners and/or following the principles through to further steps.

$$[T_{DPL}] = [T_{PL}][T_{PLRIGHT}] \quad (12)$$

$$[T_{PLRIGHT}] = [T_{PL}]^{-1}[T_{DPL}] \quad (13)$$

$$[T_{PL}] = [T_{PLEFT}][T_{PLRIGHT}] \quad (14)$$

$$[T_{PLEFT}] = [T_{PL}][T_{PLRIGHT}]^{-1} \quad (15)$$

By using this method, accurate device parameters may be extracted. Once these device parameters are extracted, a design may be altered or modified as required to meet any design rules (step 212), such as those relating to impedance, resistance, inductance, or the like. The process could then be repeated by forming the modified test structures in a semiconductor substrate and extracting particular components. Alternatively, if the design rules have been met by a particular design, the design may be implemented in manufactured integrated circuits. This may include forming lithography masks according to the design, using the lithography masks to pattern photoresists over a semiconductor substrate, etching the substrate according to how the photoresists are patterned, depositing metal or semiconductor materials, planarizing, and depositing any dielectric layer. Such processes may be damascene processes or dual damascene processes. Other structures, such as transistors or the like, may be formed by known methods. The method used to form the final integrated circuit may be by the same methods used to form the initial test structures.

Dual transmission line structure 50 in FIG. 3 is described as symmetrical. However, in this description, symmetrical also means that a portion of the structure repeats. In FIG. 3, pads 54, transmission line 60, and pads 56 repeat as, or are equivalent to, pads 56, transmission line 62, and pads 58, respectively. Other embodiments may repeat these structures, and similar principles as discussed above may apply.

Figure 4:
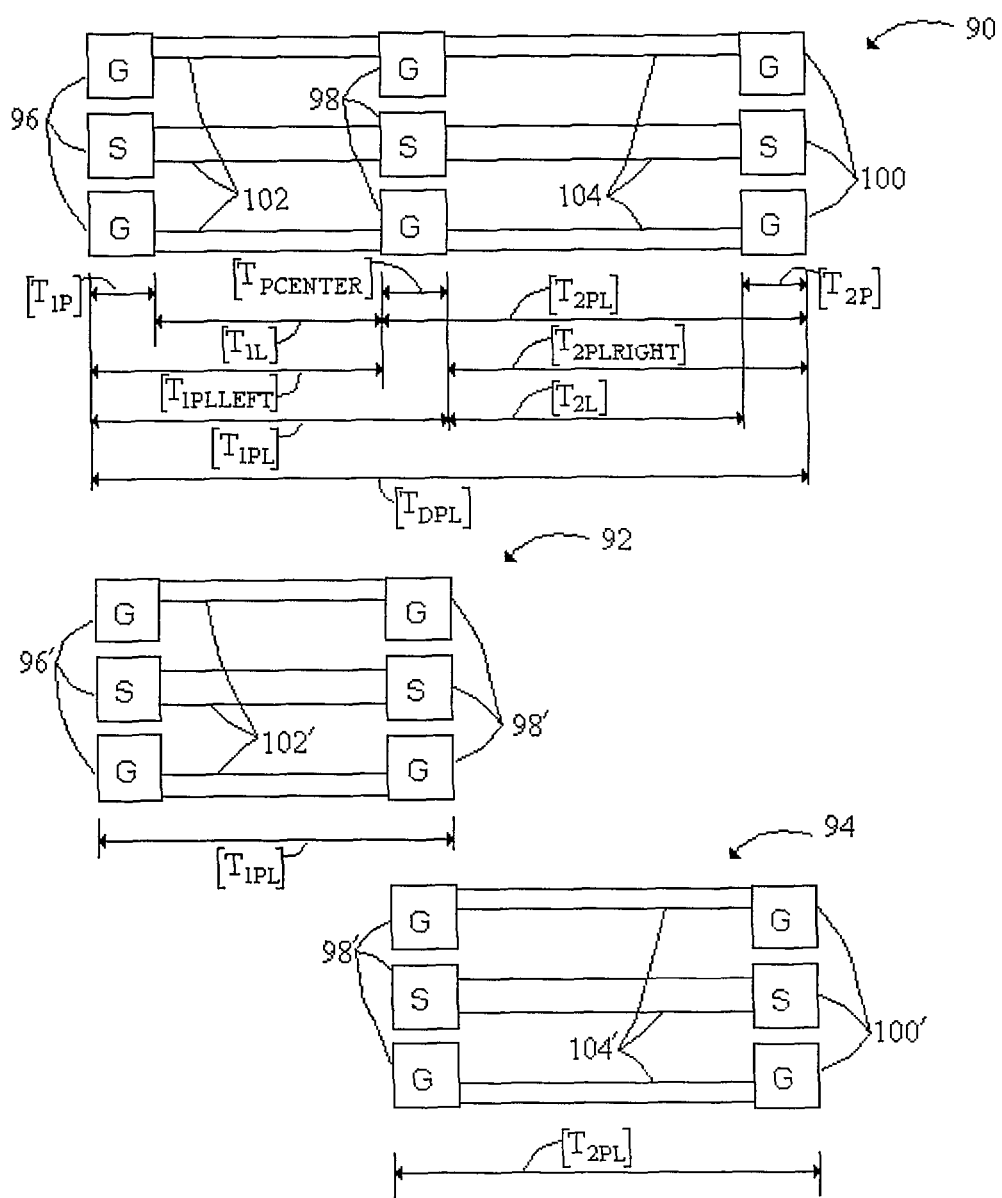
FIG. 4 is an exemplary embodiment of an asymmetric dual transmission line structure and two auxiliary transmission line structures formed in a semiconductor chip.
Figure 6B:
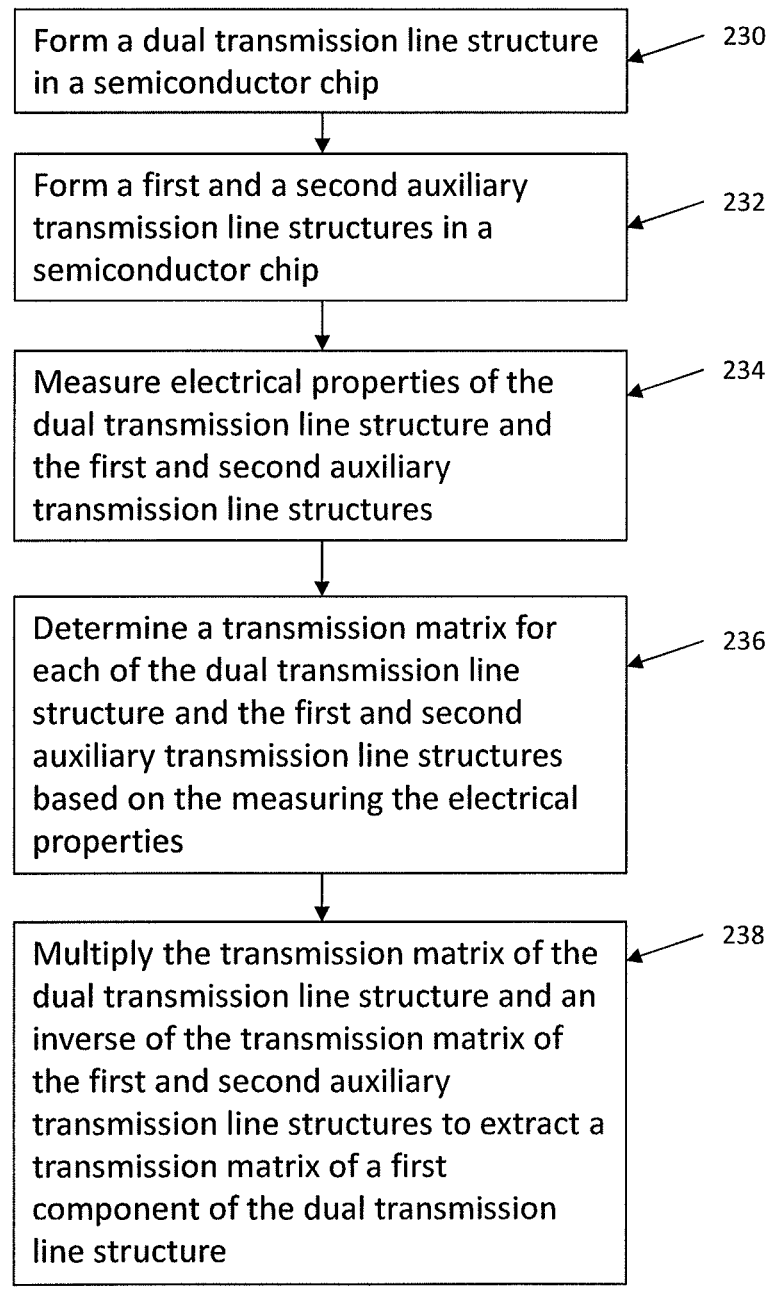

FIG. 4 illustrates an exemplary embodiment, which is also discussed in the context of the method in FIG. 6B, of an asymmetric dual transmission line structure 90 (step 230), a first auxiliary transmission line structure 92 (step 232), and a second auxiliary transmission line structure 94 (step 232) formed in a semiconductor chip. The dual transmission line structure 90 comprises pads 96, 98, and 100 and transmission lines 102 and 104 in a conventional GSG configuration. Transmission lines 104 are some amount longer than transmission lines 102. The first auxiliary transmission line structure 92 represents a first portion of the dual transmission line structure 90. Accordingly, the first auxiliary transmission line structure 92 comprises pads 96' and 98' that replicate corresponding pads 96 and 98, respectively, in the dual transmission line structure 90. Likewise, the first auxiliary transmission line structure 92 comprises transmission line 102' that replicates transmission line 102 in the dual transmission line structure 90. The second auxiliary transmission line structure 94 represents a second portion of the dual transmission line structure 90. Accordingly, the second auxiliary transmission line structure 94 comprises pads 98' and 100' that replicate corresponding pads 98 and 100, respectively, in the dual transmission line structure 90. Likewise, the second auxiliary transmission line structure 94 comprises transmission line 104' that replicates transmission line 104 in the dual transmission line structure 90. Note that these structures are illustrated for simplicity and omit many structures that may be included, such as vias, multi-level interconnects, and DUTs.

Measurement may be performed on the dual transmission line structure 90 and the first and second auxiliary transmission line structures 92 and 94 (step 234) to determine a transmission matrix for each structure (step 236), much like that discussed above. For the purposes of this discussion, matrix [$T_{DPL}$] is the transmission matrix determined from the measurements of the dual transmission line structure 90. Further, matrices [$T_{1PL}$] and [$T_{2PL}$] are the transmission matrices determined from the measurements of the first and second auxiliary transmission line structures 92 and 94, respectively.

FIG. 4 further illustrates reference lines for dividing dual transmission line structure 90 into cascaded two-port networks. The individual illustrated transmission matrices [$T_X$] will not be discussed in detail herein, except to note that the convention for the subscripts is generally the same in this embodiment as above except that a 1 represents a portion of the first auxiliary transmission line structure 92 and a 2 represents a portion of the second auxiliary transmission line structure 94. A person having ordinary skill in the art will realize that the transmission matrix [$T_{DPL}$] for the dual transmission line structure 90 is equal to the product of many different combinations of the transmission matrices illustrated, such as equation (16).

$$[T_{DPL}] = [T_{1PLLEFT}][T_{2PL}] \quad (16).$$

Using equation (16), the inverse of matrix [$T_{2PL}$] may be multiplied to both sides of the equation to cancel matrix [$T_{2PL}$] on the right hand side (step 238). The result of this action is that the transmission matrix [$T_{1PLLEFT}$] for the network consisting of pads 96 and transmission lines 102 equals the product of measured transmission matrix [$T_{DPL}$] and the inverse of measured transmission matrix [$T_{2PL}$], as shown in equation (17).

$$[T_{1PLLEFT}] = [T_{DPL}][T_{2PL}]^{-1} \quad (17)$$

Accordingly, the transmission matrix for the network consisting of the left side of the dual transmission line structure 90 may be extracted.

Once matrix $[T_{1PLLEFT}]$ is extracted, it can be used to extract further components. A person having ordinary skill in the art will further realize that matrix $[T_{1PL}]$ equals the product of matrix $[T_{1PLLEFT}]$ and matrix $[T_{PCENTER}]$, as shown in equation (18).

$$[T_{1PL}]=[T_{1PLLEFT}][T_{PCENTER}] \quad (18)$$

Multiplying the inverse of matrix $[T_{PLLEFT}]$ through the equation, while maintaining the non-commutative property of matrix multiplication, matrix $[T_{PCENTER}]$ equals the product of the inverse of matrix $[T_{1PLLEFT}]$ and matrix $[T_{1PLLEFT}]$ (step 238), as shown in equation (19).

$$[T_{PCENTER}]=[T_{1PLLEFT}]^{-1}[T_{1PL}] \quad (19)$$

Accordingly, matrix $[T_{PCENTER}]$ may be extracted.

Equations (20) through (23) illustrate another example to extract $[T_{2PLRIGHT}]$ and $[T_{PCENTER}]$ applying similar principles as discussed above with regard to equations (16) through (19). Detailed discussion is omitted for this example because a person having ordinary skill in the art will readily understand the application of the principles and computations.

$$[T_{DPL}]=[T_{1PL}][T_{2PLRIGHT}] \quad (20)$$

$$[T_{2PLRIGHT}]=[T_{1PL}]^{-1}[T_{DPL}] \quad (21)$$

$$[T_{2PL}]=[T_{PCENTER}][T_{2PLRIGHT}] \quad (22)$$

$$[T_{PCENTER}]=[T_{2PL}][T_{2PLRIGHT}]^{-1} \quad (23)$$

Although the pads 96, 98, and 100 do not have to be equivalent in this embodiment, generally no further extraction may be performed than what is illustrated in equations (18) through (21) if the pads 96, 98, and 100 are not equivalent. However, if the pads 96, 98, and 100 are substantially equivalent, all of the components of the dual transmission line structure 90 may be extracted by equating $[T_{1P}]=[T_{PCENTER}]=[T_{2P}]$ and applying algebraic manipulations similar to that discussed above. Further, the dual transmission line structure 90 in FIG. 4 can also be altered such that one of the auxiliary transmission line structures 92 or 94 repeats. Similar calculations and algebraic manipulations may be applied to extract components in such a situation.

Once the device parameters are extracted, the structure may be incorporated into an integrated circuit design and formed similar to the processes previously discussed. Also, the test structure may be modified to meet design rules. In that case, the process may be repeated to determine if the device parameters meet any necessary design rules.

Persons having skill in the art will readily understand that any transmission matrix extracted in any manner discussed above may be converted to other useful parameters or matrices. For example, the transmission matrix may be converted to scattering parameters (S-parameters), impedance parameters, or admittance parameters. Each variety of parameters represents useful data in designing and testing networks, such as the dual-port networks discussed above.

By using embodiments, accurate electrical operating parameters, such as S-parameters, may be obtained for the components of the dual transmission line structure in high frequency operation, such as beyond 30 GHz. Embodiments use actual operation measurements of structures to extract components of the dual transmission line structure as opposed to the prior art that used equivalent circuit modeling to extract components. Without the models of the prior art, the disadvantage of invalidity of the equivalent circuits in high frequency is obviated, and embodiments may accordingly accurately obtain operating parameters. Further, because the extraction is based on actual measurements and not modeling that assumes that a ground strip does not affect the structure, the parasitics caused by the ground strip are appropriately considered and over de-embedding is generally no longer a problem. Also, any discontinuities, particularly near the pads, vias, or multi-level interconnects are considered in the measurements such that the extraction is accurate.

Figure 5A:
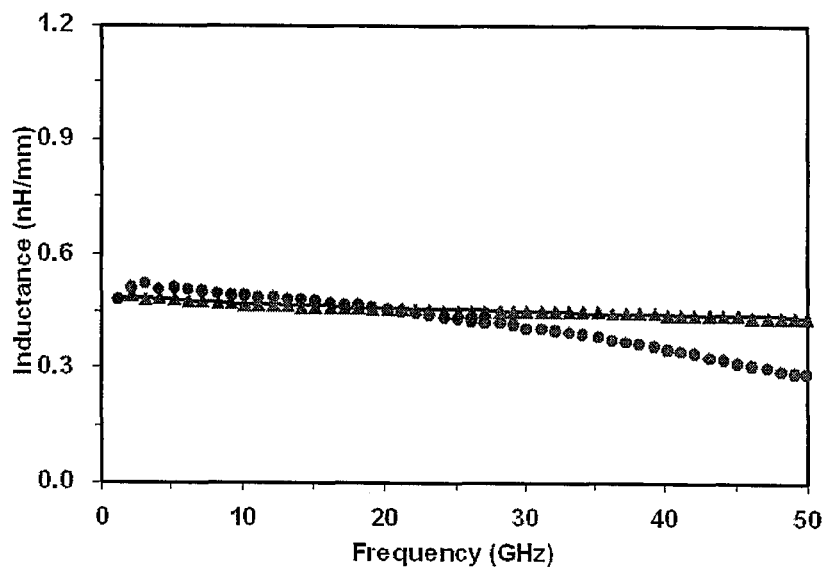
FIGS. 5A-5C are graphs illustrating advantages of embodiments over the prior art.
Figure 5B:
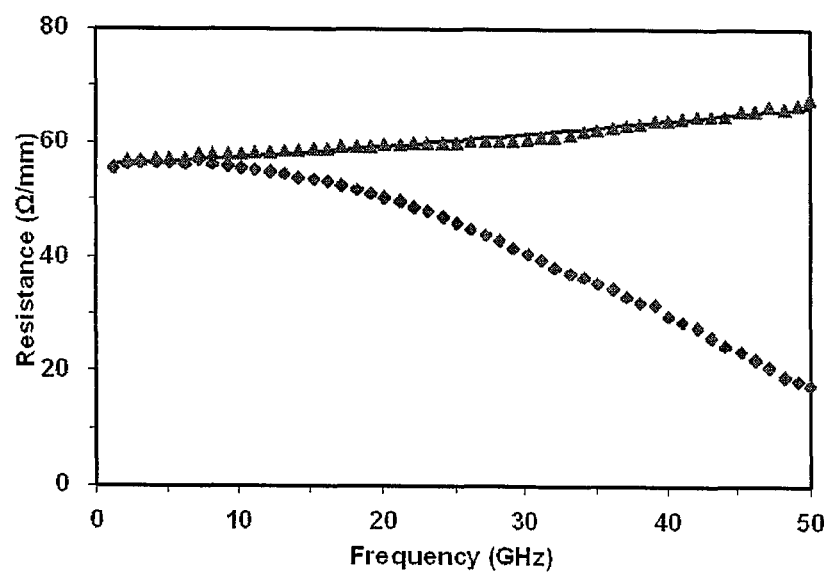
Figure 5C:
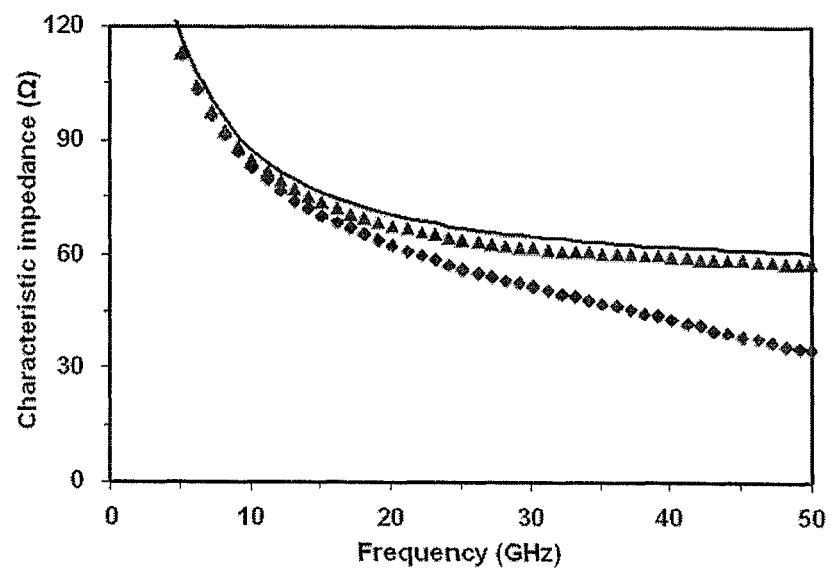

FIGS. 5A through 5C are graphs that illustrate this advantage of embodiments over the prior art. With respect to FIGS. 5A through 5C, a microstrip transmission line was formed in a semiconductor chip with corresponding pads with a length of 1,000 µm, and characteristic properties of the transmission line were extracted from the network using a prior art method and an embodiment. The embodiment used was similar to the embodiment discussed with regard to FIG. 3, such that an auxiliary microstrip transmission line with a length of 500 µm was also formed in the semiconductor chip. The transmission matrices for the pads were extracted according to an embodiment, which allowed the transmission matrix of the transmission line to be extracted. From the transmission matrix of the transmission line, the inductance, resistance, and characteristic impedance were determined, as illustrated in FIGS. 5A through 5C. For comparison, a prior art method that uses an equivalent circuit to model the pads and the interconnect was also used to extract a transmission matrix of the transmission line, from which inductance, resistance, and characteristic impedance were also determined.

In each figure, the solid line represents the ideal data for the measured structure, the triangular data points represent the extracted property at a discreet frequency taken in accordance with an embodiment, and the diamond data points represent the extracted property at a discreet frequency taken by the prior art method. FIG. 5A illustrates the inductance of the structure. FIG. 5B illustrates the resistance, and FIG. 5C shows the characteristic impedance. As can be seen from the graphs, the prior art methods tend to deviate from the ideal whereas the extracted properties taken by embodiments more closely track the ideal, particularly at high frequencies.

A further advantage of embodiments includes a smaller silicon area. Some prior art methods required the use of four to six, or more, dummy structures to make measurements and to extract components. However, as discussed above, some embodiments may only require one auxiliary structure, and others may only require two auxiliary structures. Accordingly, with the reduced number of structures, a smaller silicon area is needed for embodiments.

Although embodiments and their advantages have been described in detail, it should be understood that various changes, substitutions and alterations can be made herein without departing from the spirit and scope of the invention as defined by the appended claims. Persons having ordinary skill in the art will understand that these principles may be applied to many other embodiments not specifically recited herein. Many different patterns of the structures may be made, such as multiple repetitions of an auxiliary structure in a symmetric transmission line structure or multiple repetitions of any auxiliary structure in any combination with the other auxiliary structure in an asymmetric transmission line structure. Further, an asymmetric structure may have more than two components wherein each component is represented by a different auxiliary structure. Further, embodiments contemplate applications with other devices, such as metal-oxide-silicon field effect transistors (MOSFETs), metal-oxide-metal (MOM) capacitors, or resistors. These modifications are considered within the scope of the invention, and the above embodiments are not considered limiting.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for de-embedding, the method comprising:
   forming a primary structure in a substrate, the primary structure consisting of a first portion and a second portion, the second portion being cascaded sequentially from the first portion;
   forming an auxiliary structure in the substrate, wherein the auxiliary structure replicates one of the first portion or the second portion of the primary structure;
   determining a transmission matrix for each of the primary structure and the auxiliary structure based on measurements; and
   extracting a transmission matrix of a first component of the primary structure by determining a product of the transmission matrix of the primary structure and an inverse of the transmission matrix of the auxiliary structure.

2. The method of claim 1, wherein the auxiliary structure replicates both the first portion and the second portion of the primary structure such that the primary structure is symmetrical.

3. The method of claim 1, further comprising an additional auxiliary structure replicating the second portion of the primary structure, wherein the first portion and the second portion are different such that the primary structure is asymmetrical.

4. The method of claim 1, further comprising extracting a transmission matrix of a second component by determining a product of the transmission matrix of the auxiliary structure and an inverse of the transmission matrix of the first component.

5. The method of claim 1, wherein the primary structure comprises a transmission line.

6. A method for de-embedding a cascaded network, the method comprising:
   measuring electrical characteristics of a primary transmission line structure and a first auxiliary transmission line structure to determine a transmission matrix of each of the primary transmission line structure and the first auxiliary transmission line structure, wherein the primary transmission line structure and the first auxiliary transmission line structure are formed in substrate, and wherein the auxiliary transmission line structure replicates a first portion of the primary transmission line structure; and
   extracting a transmission matrix of a first component of the primary transmission line structure by multiplying the transmission matrix of the primary transmission line structure and an inverse of the transmission matrix of the auxiliary transmission line structure.

7. The method of claim 6, further comprising forming the primary transmission line structure and the first auxiliary transmission line structure in the substrate.

8. The method of claim 6, further comprising forming a modified primary transmission line structure in an additional substrate in response to the transmission matrix of the first component of the primary transmission line structure.

9. The method of claim 6, wherein the first auxiliary transmission line structure further replicates a second portion of the primary structure.

10. The method of claim 6, wherein the primary transmission line structure is symmetrical.

11. The method of claim 6, wherein the measuring further comprises measuring electrical characteristics of a second auxiliary transmission line structure to determine a transmission matrix of the second auxiliary transmission line structure, wherein the second auxiliary transmission line structure replicates a second portion of the primary transmission line structure and is formed in the substrate.

12. The method of claim 6, wherein the primary transmission line structure is asymmetrical.

13. The method of claim 6, further comprising extracting a transmission matrix of a second component by multiplying the transmission matrix of the auxiliary transmission line structure and an inverse of the transmission matrix of the first component.

14. A method for de-embedding components, the method comprising:
   forming a dual transmission line structure in a substrate;
   forming a first auxiliary transmission line structure in the substrate, wherein the first auxiliary transmission line structure is representative of a first portion of the dual transmission line structure;
   measuring electrical properties of the dual transmission line structure and the first auxiliary transmission line structure;
   determining a transmission matrix for each of the dual transmission line structure and the first auxiliary transmission line structure based on the measuring the electrical properties; and
   multiplying the transmission matrix of the dual transmission line structure and an inverse of the transmission matrix of the first auxiliary transmission line structure to extract a transmission matrix of a first component of the dual transmission line structure.

15. The method of claim 14, wherein the first auxiliary transmission line structure further replicates a second portion of the dual transmission line structure.

16. The method of claim 14, further comprising forming a second auxiliary transmission line structure in the substrate, wherein the second auxiliary transmission line structure is representative of a second portion of the dual transmission line structure, wherein the second portion is different from the first portion, and wherein the measuring the electrical properties further comprises measuring electrical properties of the second auxiliary transmission line structure, and wherein the determining further comprises determining a transmission matrix of the second auxiliary transmission lines structure based on the measuring the electrical properties.

17. The method of claim 16, further comprising multiplying the transmission matrix of the dual transmission line structure and an inverse of the transmission matrix of the second auxiliary transmission line structure to extract the transmission matrix of the first component of the dual transmission line structure.

18. The method of claim 14, further comprising multiplying the transmission matrix of the first auxiliary transmission line structure and an inverse of the transmission matrix of the first component to extract a transmission matrix of a second component of the dual transmission line structure.

19. The method of claim 1, wherein the primary structure consists essentially of a transmission line and pad structures.

20. The method of claim 6, wherein the primary structure consists of the first portion and a second portion, the second portion being cascaded sequentially from the first portion.

\* \* \* \* \*